United States Patent
Hamada et al.

(10) Patent No.: US 11,209,905 B2
(45) Date of Patent: Dec. 28, 2021

(54) PANEL AND ELECTRONIC APPARATUS

(71) Applicant: TAIYO YUDEN CO., LTD., Tokyo (JP)

(72) Inventors: Hiroshi Hamada, Tokyo (JP); Yukihiro Matsui, Tokyo (JP); Takashi Tomita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/991,474

(22) Filed: Aug. 12, 2020

(65) Prior Publication Data

US 2021/0048888 A1 Feb. 18, 2021

(30) Foreign Application Priority Data

Aug. 14, 2019 (JP) .............. JP2019-148723

(51) Int. Cl.
*H03B 5/32* (2006.01)
*G06F 3/01* (2006.01)
*G06F 3/041* (2006.01)

(52) U.S. Cl.
CPC .............. *G06F 3/016* (2013.01); *G06F 3/041* (2013.01)

(58) Field of Classification Search
None
See application file for complete search history.

(56) References Cited

U.S. PATENT DOCUMENTS

| 6,191,524 | B1* | 2/2001 | Sasaki | H03H 9/132 310/367 |
| 2008/0284284 | A1* | 11/2008 | Kawada | H01L 41/0906 310/323.01 |
| 2014/0347322 | A1 | 11/2014 | Kamata et al. | |
| 2018/0115301 | A1* | 4/2018 | Kaga | H01L 41/18 |

FOREIGN PATENT DOCUMENTS

| JP | 2010-231609 A | 10/2010 |
| WO | 2015/045059 A1 | 4/2015 |

* cited by examiner

*Primary Examiner* — Carl Adams
(74) *Attorney, Agent, or Firm* — Chen Yoshimura LLP (57) ABSTRACT

A panel includes a vibration plate having a generally rectangular shape; and a piezoelectric actuator that is provided on a main surface of the vibration plate and causes the vibration plate to vibrate, in which the vibration plate is configured such that a length x in mm of a long side of the vibration plate and logarithmic decrement y of the vibration plate satisfy Expression 1 below:

$y \leq 32.6 x^{-1}$ (Expression 1).

5 Claims, 7 Drawing Sheets

PANEL AND ELECTRONIC APPARATUS

BACKGROUND ART

The present disclosure relates to a panel and an electronic apparatus that generate a tactile sense with vibration.

For a touch panel or the like, an input system that generates a vibration or a tactile sense with respect to a position that a user has made an operation with a finger or the like and causes the user to recognize that the operation has been received has been developed. For example, Japanese Patent Application Laid-open No. 2010-231609 (hereinafter, referred to as Patent Literature 1) has disclosed a tactile sense presenting apparatus that causes, when a user operates an operation surface of a panel, a vibration element attached to the panel vibrates such that the user recognizes the input operation.

SUMMARY OF THE INVENTION

Patent Literature 1 has proposed generating a tactile sense in the panel by causing the vibration element to vibrate at a frequency (approximately 20 kHz or more) higher than that of the audible region. However, Patent Literature 1 has not disclosed suitable panel physical properties in driving in the ultrasonic wave/ultrasonic region, and favorable standing waves may be generated or may not be generated in a manner that depends on the material, the shape, and the structure of the panel. In a case of a panel in which it is difficult to generate standing waves, it is necessary to increase the voltage to be input, and there are problems related to lowering of the reliability and an increase in power consumption due to heat generation of the vibration element.

In view of the circumstances as described above, it is desirable to provide a panel and an electronic apparatus that are capable of vibrating at a frequency in the ultrasonic wave/ultrasonic region to generate standing waves.

According to an embodiment of the present disclosure, a panel includes a vibration plate having a generally rectangular shape and a piezoelectric actuator.

The piezoelectric actuator is provided on a main surface of the vibration plate and causes the vibration plate to vibrate.

The vibration plate is configured such that a length x in mm of a long side of the vibration plate and logarithmic decrement y of the vibration plate satisfy Expression 1 below:

$$y \leq 32.6x^{-1} \quad \text{(Expression 1)}.$$

The vibration plate may have vibration velocity of 0.8 m/sec or more.

Here, the piezoelectric actuator may be configured such that a wavelength λ in mm of a standing wave generated in the vibration plate and a ratio R of a width of the piezoelectric actuator to the wavelength λ of the standing wave satisfy the following expression:

$$0.021\lambda - 0.087 \leq R \leq 0.011\lambda + 0.878$$

The width of the piezoelectric act may be 0.2 times or more of the wavelength of the standing wave and 1.0 times or less of the wavelength of the standing wave.

According to an embodiment of the present disclosure, an electronic apparatus includes a panel.

The panel includes a vibration plate, a piezoelectric actuator that is provided on a main surface of the vibration plate and causes the vibration plate to vibrate, and a fixing portion that is constituted by an elastic material and supports the vibration plate.

The vibration plate is configured such that a length x in mm of a long side of the vibration plate and logarithmic decrement y of the vibration plate satisfy Expression 1 below:

$$y \leq 32.6x^{-1} \quad \text{(Expression 1)}.$$

As described above, in accordance with the present disclosure, it is possible to provide a panel and an electronic apparatus that are capable of vibrating at a frequency in an ultrasonic wave/ultrasonic region to generate standing waves.

These and other objects, features and advantages of the present disclosure will become more apparent in light of the following detailed description of embodiments thereof, as illustrated in the accompanying drawings.

It is to be understood that both the foregoing general description and the following detailed description are exemplary and explanatory, and are intended to provide further explanation of the disclosure as claimed.

DETAILED DESCRIPTION OF THE EMBODIMENTS

A panel according to an embodiment of the present disclosure and an electronic apparatus that installs this panel will be described with reference to the drawings.

[Configuration of Panel]

Figure 1:
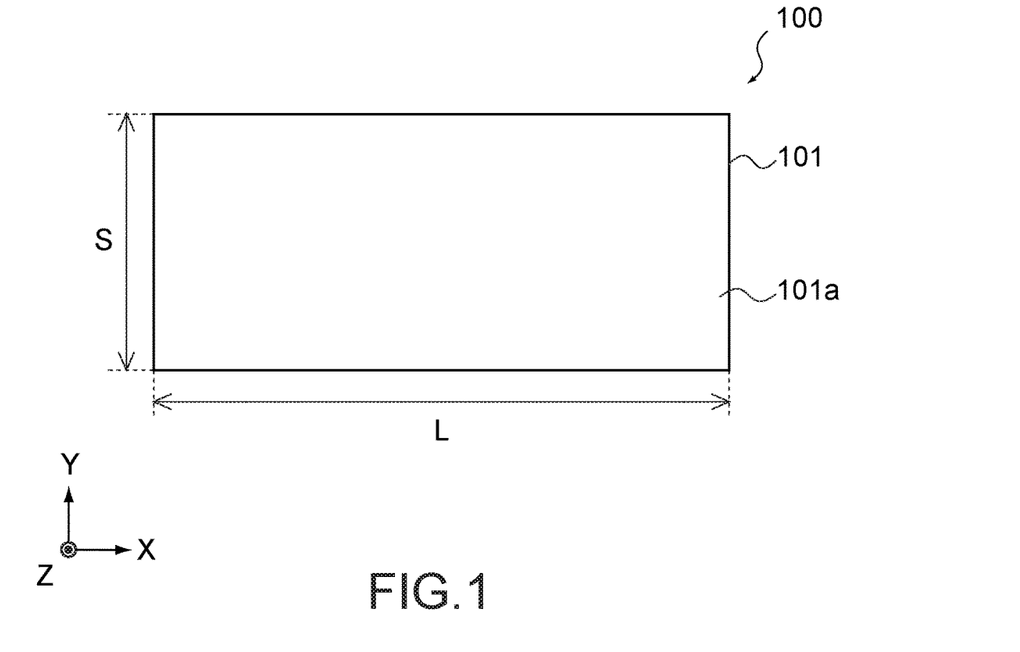
FIG. 1 is a plan view as a panel according to an embodiment of the present disclosure is viewed in one direction.
Figure 2:
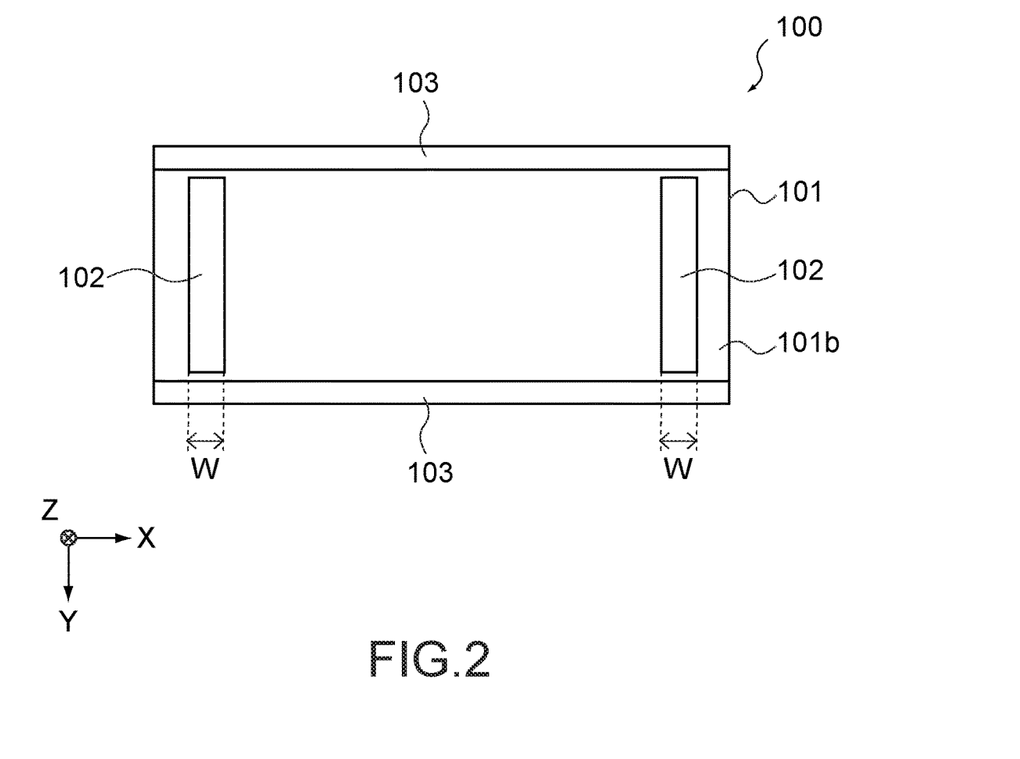
FIG. 2 is a plan view as the panel is viewed in an opposite direction.
Figure 3:
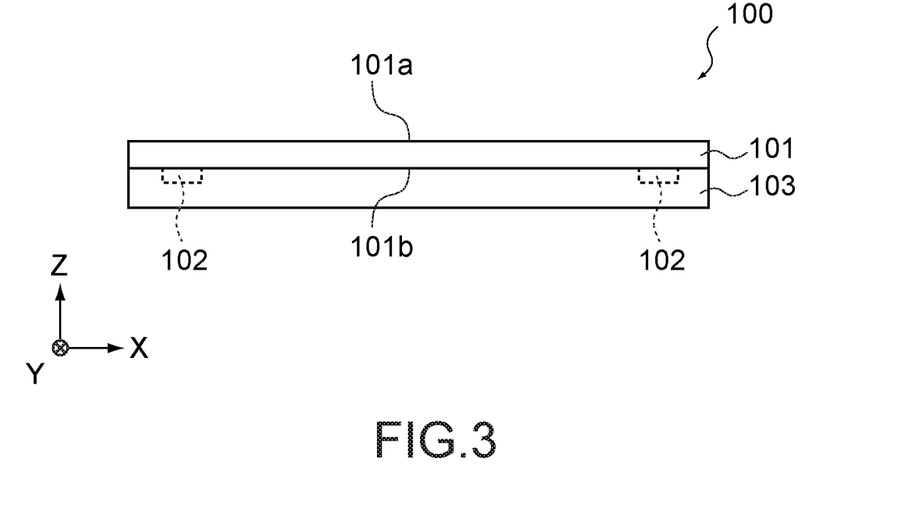
FIG. 3 is a plan view as the panel is viewed in a side surface direction.

FIG. 1 is a plan view of a top surface side of a panel 100 according to this embodiment and FIG. 2 is a plan view on a back surface side of the panel 100. FIG. 3 is a side view of the panel 100. It should be noted that an X direction, a Y direction, and a Z direction are three directions orthogonal to one another in each of the figures shown below.

As shown in FIGS. 1 to 3, the panel 100 includes a vibration plate 101, piezoelectric actuators 102, and fixing portions 103.

The vibration plate 101 is a plate-like member that vibrates owing to the piezoelectric actuators 102. Main surfaces of the vibration plate 101 can each have a rectangular shape. Hereinafter, one of the main surfaces of the vibration plate 101 will be referred to as a first surface 101a and the other of the main surfaces of the first surface 101a, which is opposite to the one main surface, will be referred to as a second surface 101b. Further, a direction along a long side of the vibration plate 101 is set as the X direction and a direction along a short side of the vibration plate 101 is set as the Y direction. That is, the first surface 101a and the second surface 101b are surfaces parallel to an X-Y plane.

The vibration plate 101 is made of a material such as glass and plastic as will be described later. The size of the vibration plate 101 is not particularly limited. For example, a length L of a long side (X direction) can be about 140 mm and a length S of a short side (Y direction) can be about 70 mm. A ratio (aspect ratio) of the long side to the short side is also not limited to 2 to 1.

The piezoelectric actuators 102 are provided on the second surface 101b and causes the vibration plate 101 to vibrate. Further, the piezoelectric actuators 102 may be provided on the first surface 101a. The piezoelectric actuators 102 each include a positive electrode, a negative electrode, and a piezoelectric material layer. When a voltage is applied between the positive electrode and the negative electrode, the piezoelectric material layer is deformed due to an inverse piezoelectric effect and a vibration is generated. The piezoelectric actuators 102 may each have a laminate structure in which the positive electrode and the negative electrode are alternately stacked with the piezoelectric material layer being interposed therebetween or may have another structure.

Each of the piezoelectric actuators 102 can be arranged at each of both end portions of the vibration plate 101 in a long side direction (x direction) as shown in FIG. 2. Further, the arrangement of the piezoelectric actuators 102 and the number of piezoelectric actuators 102 are not limited to those shown in FIG. 2. The piezoelectric actuators 102 can be bonded to the second surface 101b with an adhesive or the like. An element width W (X direction) that is a width of each of the piezoelectric actuators 102 will be described later.

The fixing portions 103 are provided on the second surface 101b and support the vibration plate 101 such that the vibration plate 101 is capable of vibrating. The fixing portions 103 are each constituted by an elastic material such as a double sided tape and an adhesive and are capable of fixing the vibration plate 101 to a fixation target object such as a casing of the electronic apparatus. The fixing portions 103 can be provided along two long sides of the second surface 101b as shown in FIG. 2. Further, the fixing portions 103 may be provided at other positions on the second surface 101b.

[Regarding Vibration Damping of Vibration Plate]

Figure 4A:
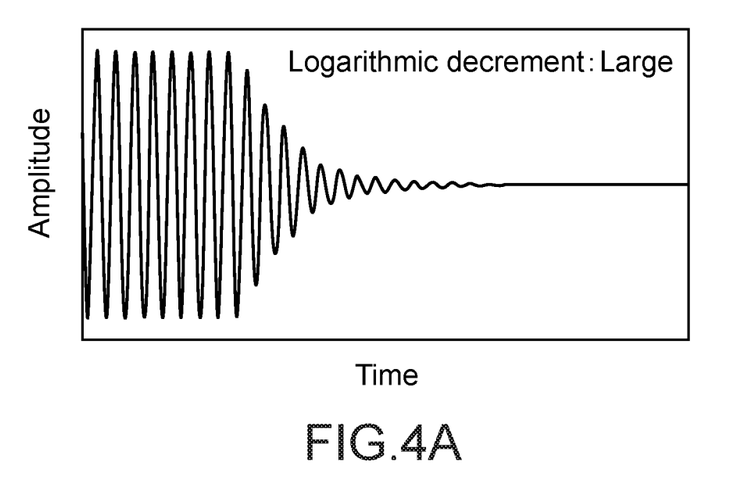
FIGS. 4A and 4B are graphs each showing a relationship between logarithmic decrement and amplitude.
Figure 4B:
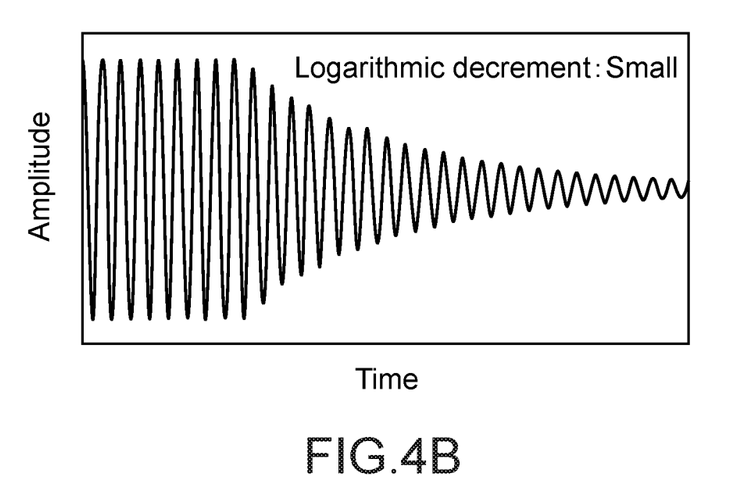

The vibration plate 101 has a predetermined damping property in a manner that depends on a material, a thickness, and the like. The logarithmic decrement can be used as a parameter indicating a damping property. FIGS. 4A and 4B are graphs each showing a damping property of the vibration plate having a particular configuration. FIG. 4A shows a damping property of the vibration plate with which the logarithmic decrement is larger. FIG. 4B shows a damping property of the vibration plate with which the logarithmic decrement is smaller.

As shown in FIG. 4A, the amplitude of the vibration plate sharply decreases along with the elapse of time in the vibration plate with the larger logarithmic decrement. On the other hand, as shown in FIG. 4B, the amplitude slowly decreases along with the elapse of time in the vibration plate with the smaller logarithmic decrement.

[Operation of Panel]

Figure 5:
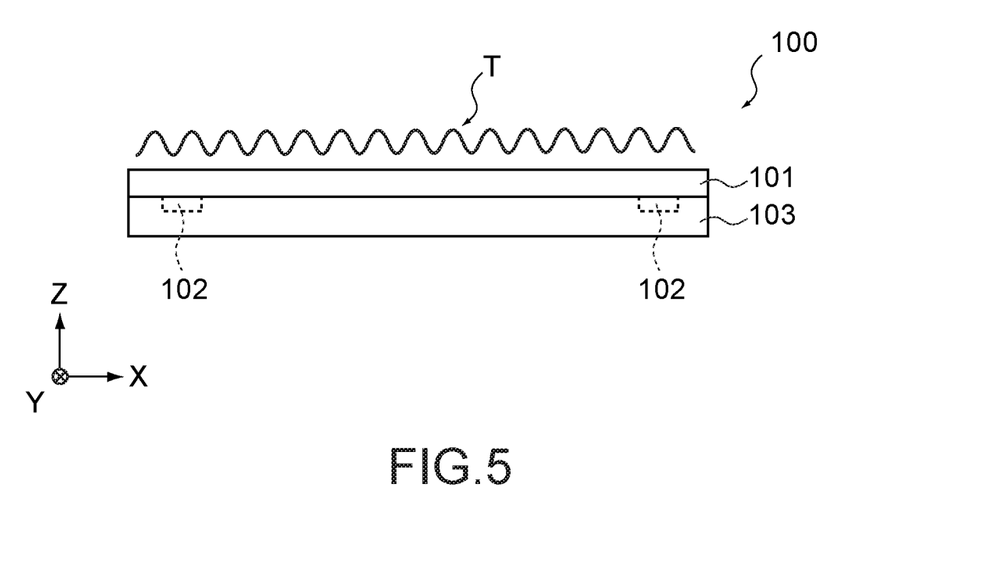
FIG. 5 is a schematic view showing standing waves in a vibration plate of the panel.

In the panel 100 having the above-mentioned configuration, when the piezoelectric actuators 102 are driven, vibrations generated by the piezoelectric actuators 102 reflect on the end portions of the vibration plate 101 and resonate at a certain frequency, such that standing waves having larger amplitude are generated. FIG. 5 is a schematic view showing a standing wave T in the vibration plate 101.

Here, smaller logarithmic decrement of the vibration plate 101 enables to vibration reflection to be repeated for longer time and standing waves having larger amplitude to be generated. Due to this standing wave, a squeeze effect is obtained. The squeeze effect is an effect to reduce the frictional force of the surface of the vibration plate 101 in such a manner that a contact object (e.g., user's finger) to the vibration plate 101 floats due to the vibration (see WO 2015/045059).

When the squeeze effect occurs while the user is touching the first surface 101a with the finger or the like, the user can feel a tactile sense change owing to lowering of the frictional force due to the squeeze effect. In a case where the length (in X direction) of the vibration plate 101 is different, the distance between the contact point and the end portion of the vibration plate 101 is also different, such that the logarithmic decrement necessary for producing the squeeze effect is also different.

[Regarding Logarithmic Decrement of Vibration Plate]

Figure 6:
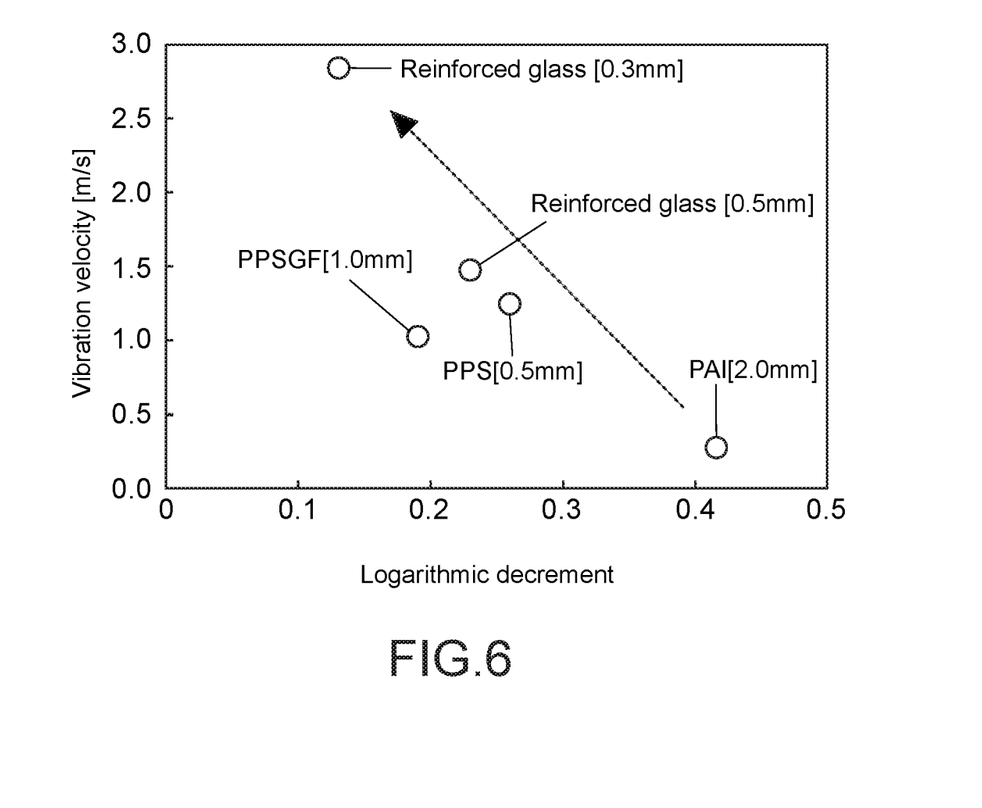
FIG. 6 is a graph showing a relationship between logarithmic decrement and vibration velocity according to the material and thickness of the vibration plate.

FIG. 6 is a graph showing a relationship between the logarithmic decrement and the vibration velocity according to the material and thickness of the vibration plate 101. As shown in the figure, the logarithmic decrement and vibration velocity of the vibration plate take predetermined values according to the material and thickness of the vibration plate 101. It should be noted that the vibration velocity can be measured in the surface of the vibration plate 101 by the use of a laser Doppler vibrometer or the like.

The figure shows logarithmic decrement and vibration velocity of a reinforced glass (thickness of 0.3 mm), a reinforced glass (thickness of 0.5 mm), a polyphenylenesulfide+glass fiber (PPSGF: polyphenylenesulfide to which glass fiber has been added, thickness of 1.0 mm), a polyphenylenesulfide (PPS: thickness of 0.5 mm), and a polyamide-imide (PAI: thickness of 2.0 mm).

As shown in the figure, a relationship (in the figure, the arrow) that the vibration velocity (amplitude) of the standing wave becomes larger as the logarithmic decrement of the vibration plate 101 becomes smaller is established. Therefore, it is possible to feel a much larger tactile sense change because of lowering of the frictional force due to the squeeze effect as the logarithmic decrement of the vibration plate 101 becomes smaller. The heat generation and power consumption of the piezoelectric actuators 102 do not become problems and the vibration velocity necessary for generating a tactile sense change with standing waves is 0.8 msec or more.

Figure 7:
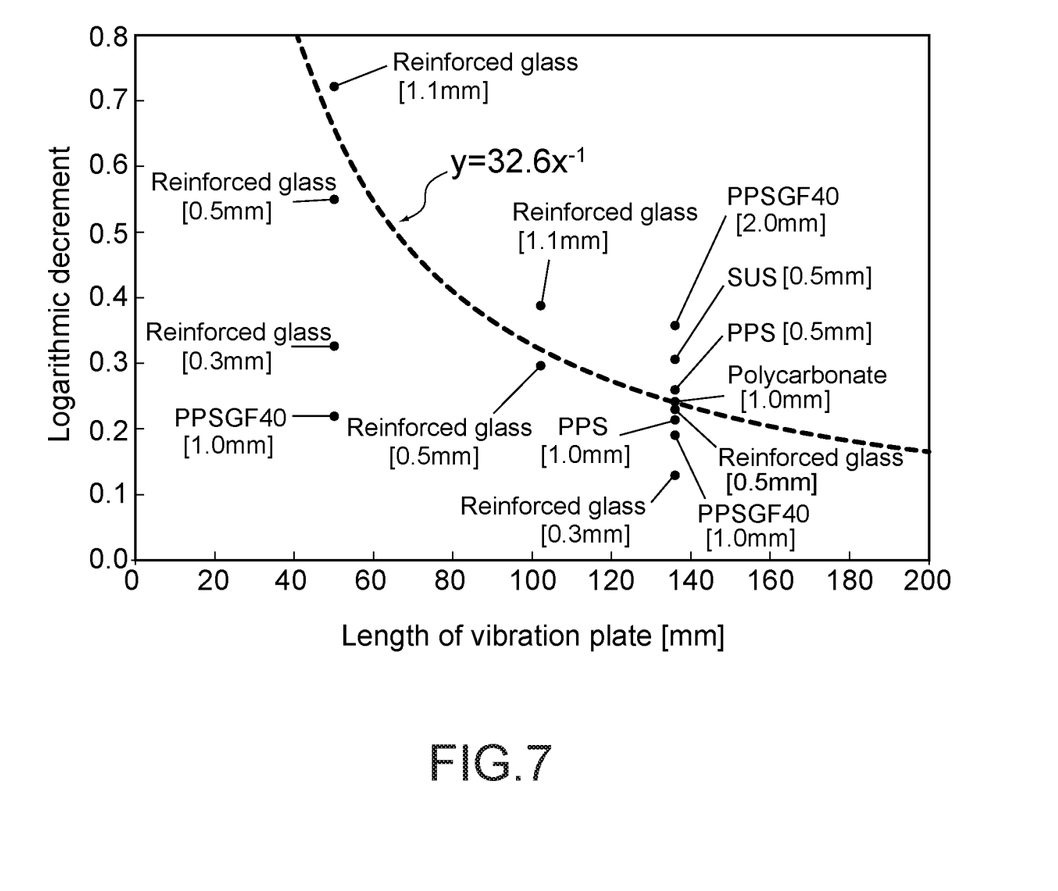
FIG. 7 is a graph showing a relationship between the length of the vibration plate and the logarithmic decrement.

FIG. 7 is a graph showing a relationship between the length L (in X direction) of the vibration plate 101 and the logarithmic decrement. The figure shows a relationship between the length of the vibration plate and the logarithmic decrement of a reinforced glass (thickness of 0.3 mm), a reinforced glass (thickness of 0.5 mm), a reinforced glass (thickness of 1.1 mm), a polyphenylenesulfide+glass fiber: polyphenylenesulfide+glass fiber 40wt % (PPSGF40, thickness of 1.0 mm), a PPSGF40 (thickness of 2.0 mm), a polyphenylenesulfide (PPS: thickness of 0.5 mm), a PPS (thickness of 1.0 mm), a polycarbonate (thickness of 1.0 mm), a steel use stainless (SUS, thickness of 0.5 mm).

As a result of detection, it has been proven that provided that the length L (in X direction) of the vibration plate 101 is denoted by x (mm) and the logarithmic decrement is denoted by y, vibration velocity of 0.8 msec or more is obtained and the tactile sense with standing waves can be sufficiently obtained in a region on a side of a point of origin with respect to a curve shown in (Expression 1) below (in the figure, region on a lower side of the curve).

$$y=32.6x^{-1} \quad \text{(Expression 1)}$$

Specifically, the reinforced glass (thickness of 0.3 mm and thickness of 0.5 mm), the PPS (thickness of 1.0 mm), and the PPSGF40 (thickness of 1.0 mm) are positioned in the region on the side of the point of origin with respect to the curve shown in (Expression 1) even when the length of the vibration plate 101 is changed.

Further, in a region on an upper side with respect to the curve, sufficient vibration velocity is not obtained in the vibration plate 101 and higher voltage is necessary for generating a tactile sense, which leads to lowering of the reliability and an increase in power consumption due to heat generation. Specifically, the PAI corresponds to it.

As described above, when the logarithmic decrement is plotted to the length (in X direction) of the vibration plate 101, the vibration plate 101 whose length, material, and thickness are configured such that the logarithmic decrement and the length (in X direction) of the vibration plate 101 are in the region on the side of the point of origin with respect to the curve shown in (Expression 1) has vibration velocity of 0.8 msec or more and it is possible to favorably generate a tactile sense with standing waves.

It should be noted that (Expression 1) was derived in the following manner. In a damped free vibration waveform, the logarithmic decrement is obtained by taking a natural logarithm of a ratio of amplitudes adjacent to each other and provided that an nth amplitude at a point of time $t_n$ is denoted by an amplitude $a_n$, an n+1th amplitude is denoted by an amplitude $a_{n+1}$, and an n+mth amplitude is denoted by an amplitude $a_{n+m}$ in the same waveform, logarithmic decrement $\delta$ is expressed by (Expression 2) below.

[Formula 1]

$$\delta = \frac{1}{m} \cdot \ell n \frac{a_n}{a_{n+m}} \quad \text{Expression (2)}$$

According to (Expression 2), (Expression 3) below is derived.

$$a_{n+m}=a_n*\exp(-\delta*m) \quad \text{(Expression 3)}$$

As shown in (Expression 3), when the logarithmic decrement becomes double, the cycle in which the amplitudes become equal becomes ½. Assuming that the widths of standing waves generated in the vibration plate 101 are the same, the cycle can be interpreted as the length L of the vibration plate 101.

Therefore, provided that a cycle (length of the vibration plate) in a case of obtaining vibration velocity having a certain amplitude is denoted by x and the logarithmic decrement is denoted by y, the constant is denoted by a, a relationship between them can be expressed by (Expression 4) below.

$$y=a*x^{-1} \quad \text{(Expression 4)}$$

Considering a condition to be the vibration velocity of 0.8 m/s or more on the basis of the length of 136 mm of the vibration plate 101 with which a largest number of points were measured in the graph of FIG. 7, it has been judged that a =32.6 is suitable and the curve according to (Expression 1) was created. Further, it has been confirmed that also in a point of a vibration plate having another length, there is consistency with this curve.

Figure 8:
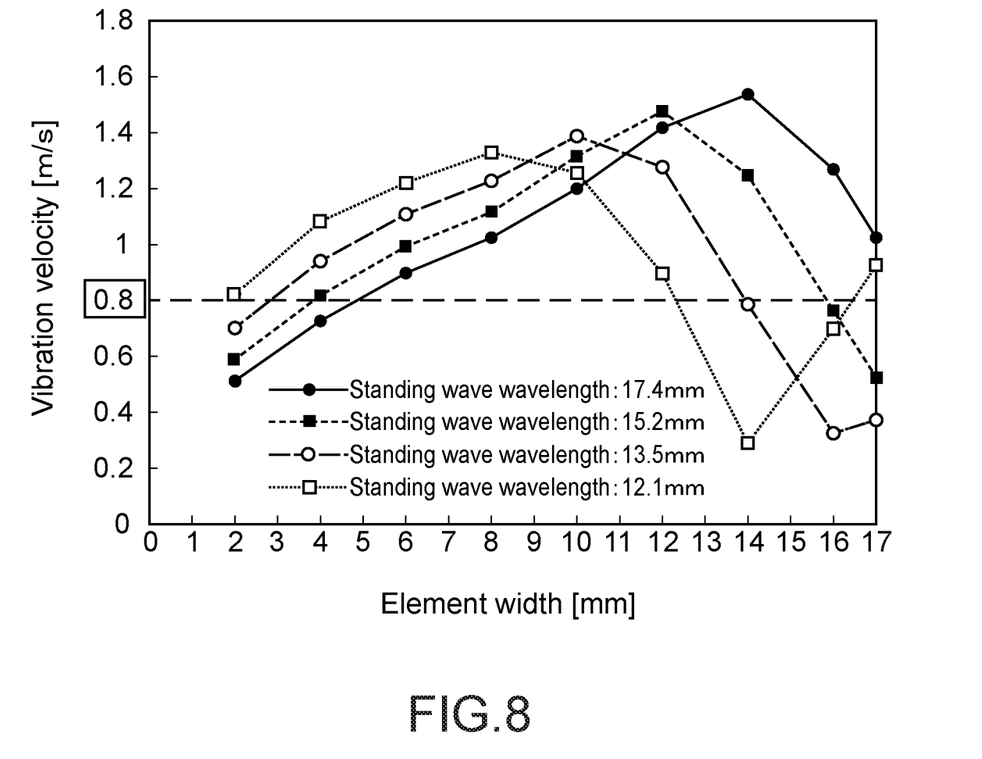
FIG. 8 is a graph showing a relationship between an element of a piezoelectric actuator and maximum vibration velocity of the vibration plate, the piezoelectric actuator and the vibration plate being provided in the panel.

FIG. 8 shows a simulation result of the maximum vibration velocity of the vibration plate 101 in a case where the element width W (see FIG. 2) of each of the piezoelectric actuators 102 has been changed with respect to the wavelength of the standing wave generated on the vibration plate 101. In a case where as shown in the figure, the element width with which the vibration velocity becomes maximum with respect to the wavelength of the standing wave exists and, for example, the wavelength of the standing wave is 17.4 mm, the vibration velocity becomes maximum when the element width W is 14 mm. On the other hand, in a case where the wavelength of the standing wave is 12.1 mm, the vibration velocity becomes maximum when the element width W is 8 mm. A larger tactile sense is obtained as the vibration velocity of the vibration plate 101 becomes higher.

Figure 9:
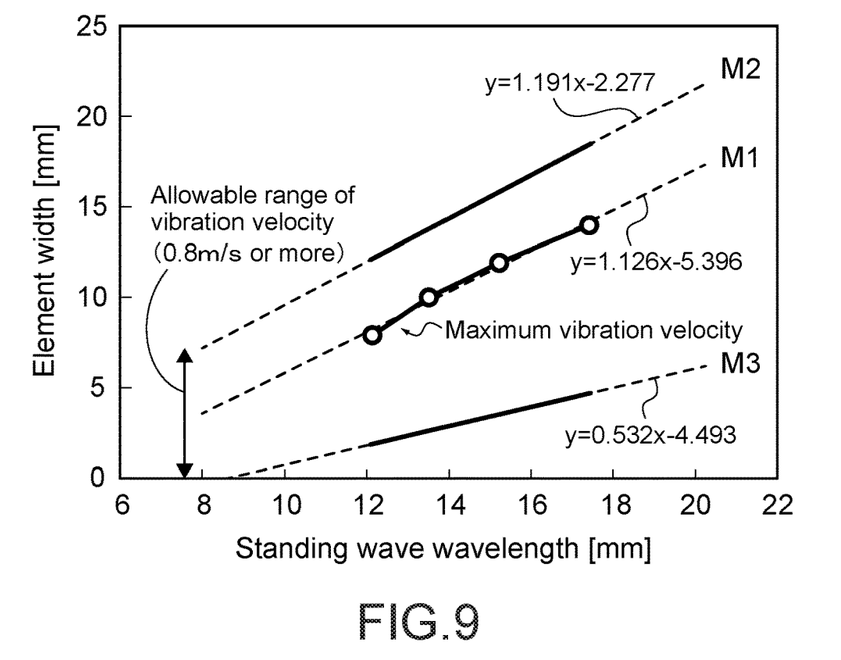
FIG. 9 is a graph of the element width with which the vibration velocity to the wavelength of the standing wave becomes maximum.

FIG. 9 shows a graph in which the element width W with which the vibration velocity of the vibration plate 101 becomes maximum with respect to the wavelength of the standing wave is plotted on the basis of the simulation result shown in FIG. 8. As shown in the figure, provided that the standing-wave wavelength is denoted by x (or alternatively λ) (mm) and the element width W is denoted by y (mm), the element width W with which the vibration velocity becomes maximum can be approximated by a straight line M1 expressed by (Expression 5) below.

$$y=1.126x-5.396 \quad \text{(Expression 5)}$$

Further, in FIG. 9, regarding the range of the element width W with which the vibration velocity (0.8 m/s or more) favorable for generating a tactile sense is obtained, the upper limit is expressed as a straight line M2 expressed by (Expression 6) below and the lower limit is expressed as a straight line M3 expressed by (Expression 7) below.

$$y=1.191x-2.277 \quad \text{(Expression 6)}$$

$$y=0.532x-4.493 \quad \text{(Expression 7)}$$

Figure 10:
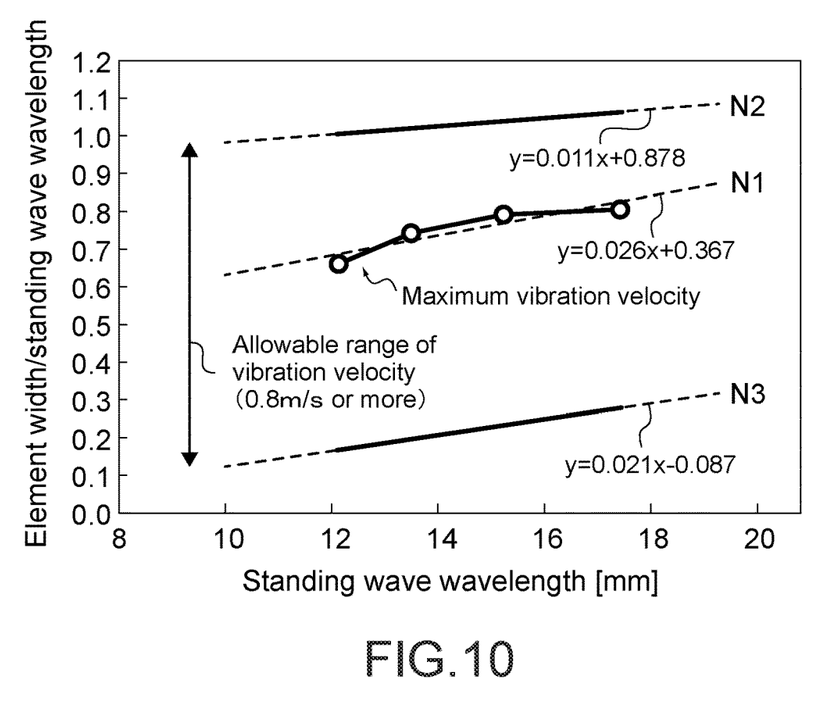
FIG. 10 is a graph of an element width/standing-wave wavelength ratio at which the vibration velocity to the wavelength of the standing waves becomes maximum.

FIG. 10 is a modification of FIG. 9 and shows a graph in which the vertical axis of FIG. 9 is set as an element width W/standing-wave wavelength. In the figure, provided that the standing-wave wavelength is denoted by x (or alternatively λ) (mm) and the element width W/standing-wave wavelength is denoted by y (or alternatively R), the element width W with which the vibration velocity becomes maximum can be approximate to a straight line N1 expressed by (Expression 8) below.

$$y=0.026x+0.367 \quad \text{(Expression 8)}$$

Further, in FIG. 10, regarding the range of the element width W/standing-wave wavelength y (or alternatively R) in which the vibration velocity (0.8 m/s or more) favorable for generating a tactile sense is obtained, the upper limit is expressed as a straight line N2 expressed by (Expression 9) below and the lower limit is expressed as a straight line N3 expressed by (Expression 10) below.

$$y=0.011x+0.878 \quad \text{(Expression 9)}$$

$$y=0.021x-0.087 \quad \text{(Expression 10)}$$

As shown in FIG. 10, the vibration velocity of the vibration plate 101 becomes maximum in a case where the element width W is approximately 0.7 times or more the standing-wave wavelength and 0.8 times or less the standing-wave wavelength and the vibration velocity of the vibration plate 101 becomes the favorable vibration velocity (0.8 m/s or more) in a case where the element width W is approximately 0.2 times or more the standing-wave wavelength and 1.0 times or less the standing-wave wavelength.

As described above, the standing-wave wavelength varies depending on the driving frequency of the piezoelectric actuators 102, and thus the vibration velocity of the vibration plate 101 becomes higher by setting the element width W to be suitable for it and the tactile sense can be improved.

[Electronic Apparatus]

The panel 100 can be installed in the electronic apparatus by being fixed to a fixation target member through the fixing portions 103. The fixation target member is the casing of the electronic apparatus for example. The panel 100 can be utilized as a device that presents a tactile sense or feedback to the user with standing waves, such as a touch panel and a touch sensor.

[Modified Example]

While the embodiment of the present disclosure has been described, the present disclosure is not limited to the embodiment described above, and it should be appreciated that the present disclosure may be variously modified.

The shape of the vibration plate 101 is not limited to the flat plate and may be curved. Further, the main surface of the vibration plate 101 is not limited to the rectangular shape and may be a trapezoidal shape, a circular shape, an elliptical shape, or the like.

What is claimed is:

1. A panel, comprising:
   a vibration plate of a generally rectangular shape; and
   a piezoelectric actuator that is provided on a main surface of the vibration plate and causes the vibration plate to vibrate, wherein the vibration plate is configured such that a length x in mm of a long side of the vibration plate and logarithmic decrement y of the vibration plate satisfy Expression 1 below:

$$y \leq 32.6x^{-1} \qquad \text{(Expression 1)}.$$

2. The panel according to claim 1, wherein the vibration plate has vibration velocity of 0.8 msec or more.

3. The panel according to claim 1, wherein the piezoelectric actuator is configured such that a wavelength $\lambda$ in mm of a standing wave generated in the vibration plate and a ratio R of a width of the piezoelectric actuator to the wavelength $\lambda$ of the standing wave satisfy the following expression:

$$0.021\lambda - 0.087 \leq R \leq 0.011\lambda + 0.878.$$

4. The panel according to claim 3, wherein the width of the piezoelectric actuator is 0.2 times or more of the wavelength $\lambda$ of the standing wave and 1.0 times or less of the wavelength $\lambda$ of the standing wave.

5. An electronic apparatus, comprising
   a panel including a vibration plate of a generally rectangular shape, a piezoelectric actuator that is provided on a main surface of the vibration plate and causes the vibration plate to vibrate, and a fixing portion that is constituted by an elastic material and supports the vibration plate,
   wherein the vibration plate is configured such that a length x in mm of a long side of the vibration plate and logarithmic decrement y of the vibration plate satisfy Expression 1 below:

$$y \leq 32.6x^{-1} \qquad \text{(Expression 1)}.$$

* * * * *